(12) United States Patent
Tashima et al.

(10) Patent No.: US 10,312,394 B2
(45) Date of Patent: Jun. 4, 2019

(54) PHOTOVOLTAIC CELL MODULE

(71) Applicant: SOLAR FRONTIER K.K., Tokyo (JP)

(72) Inventors: Yuusuke Tashima, Tokyo (JP); Hiroshi Igoshi, Tokyo (JP); Shunichi Oonishi, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 0 days.

(21) Appl. No.: 15/512,126

(22) PCT Filed: Sep. 11, 2015

(86) PCT No.: PCT/JP2015/075854
§ 371 (c)(1),
(2) Date: Mar. 17, 2017

(87) PCT Pub. No.: WO2016/043137
PCT Pub. Date: Mar. 24, 2016

(65) Prior Publication Data
US 2017/0278993 A1    Sep. 28, 2017

(30) Foreign Application Priority Data
Sep. 19, 2014 (JP) .................... 2014-191158

(51) Int. Cl.
*H01L 31/049* (2014.01)
*H02S 30/10* (2014.01)
(Continued)

(52) U.S. Cl.
CPC .... *H01L 31/0481* (2013.01); *H01L 31/02021* (2013.01); *H01L 31/049* (2014.12);
(Continued)

(58) Field of Classification Search
CPC ............. H01L 31/0481; H01L 31/049; H01L 31/0203; H01L 31/02; H01L 31/048
See application file for complete search history.

(56) References Cited

U.S. PATENT DOCUMENTS 5,578,142 A * 11/1996 Hattori ............... H01L 31/048
136/251
2005/0224108 A1 * 10/2005 Cheung ............... H01L 31/048
136/251
(Continued)

FOREIGN PATENT DOCUMENTS

JP    2010-067695    3/2010
JP    2011-086841    4/2011
(Continued)

OTHER PUBLICATIONS

International Search Report dated Oct. 27, 2015 (PCT/JP2015/075854).

*Primary Examiner* — Susan D Leong
(74) *Attorney, Agent, or Firm* — IPUSA, PLLC

(57) ABSTRACT

A photovoltaic cell module includes a photovoltaic cell panel whose planar shape is a rectangular shape; an insulating material adhered to the photovoltaic cell panel, so as to cover the photovoltaic cell panel from an outer peripheral part on a light receiving surface side, via a side end surface, to an outer peripheral part on a back surface side; and a frame member configured to protect a periphery of the photovoltaic cell panel to which the insulating material is adhered, wherein among a first side and a second side of the photovoltaic cell panel facing each other, at least on the first side, the insulating material, which is adhered to the light receiving surface and the side end surface of the photovoltaic cell panel, and the frame member can be spaced apart from each other.

6 Claims, 6 Drawing Sheets

(51) Int. Cl.
    *H01L 31/048*    (2014.01)
    *H01L 31/02*    (2006.01)
    *H01L 31/05*    (2014.01)
    *H01L 31/18*    (2006.01)

(52) U.S. Cl.
    CPC .......... *H01L 31/0504* (2013.01); *H01L 31/18* (2013.01); *H02S 30/10* (2014.12); *Y02E 10/50* (2013.01)

(56) References Cited

U.S. PATENT DOCUMENTS

| | | |
|---|---|---|
| 2011/0088756 A1 | 4/2011 | Fujii et al. |
| 2013/0125984 A1 | 5/2013 | Huang |
| 2013/0213458 A1* | 8/2013 | Tsujimoto ........... H01L 31/0424 136/251 |
| 2013/0220418 A1 | 8/2013 | Heidtman et al. |
| 2016/0197218 A1 | 7/2016 | Itami et al. |

FOREIGN PATENT DOCUMENTS

| | | |
|---|---|---|
| JP | 2012-001707 | 1/2012 |
| JP | 2012-253063 | 12/2012 |
| WO | 2013/127811 | 9/2013 |
| WO | 2014/103794 | 7/2014 |

\* cited by examiner

PHOTOVOLTAIC CELL MODULE

TECHNICAL FIELD

The present invention is related to a photovoltaic cell module.

BACKGROUND

A photovoltaic cell module is generally constituted by a photovoltaic cell panel in which a photovoltaic cell element is formed, and a frame member referred to as a frame (a metal frame, etc.) surrounding the peripheral end part of the photovoltaic cell panel. The photovoltaic cell panel is covered by a protection member (for example, a cover glass and a protecting sheet using PET, etc.), to which the photovoltaic cell element, which is formed on a substrate, is adhered by a sealing material (for example, EVA and PVB, etc.).

Here, in a photovoltaic cell panel, from the viewpoint of safety, to prevent a user from receiving an electric shock by the electric power generated by the photovoltaic cell element, there is a need to provide a part, which is covered by an insulating member, along a certain distance (referred to as a creepage distance), between the photovoltaic cell element and the end part of the photovoltaic cell panel.

This creepage distance is described by referring to FIG. 1. Note that FIG. 1 is a cross-sectional view in which the end part of a substrate type thin-film photovoltaic cell panel is enlarged. In a photovoltaic cell panel 200 illustrated in FIG. 1, a photovoltaic cell element 220 is formed on a substrate 210, and a front surface protective layer 230 is adhered, by a sealing material 240, on the side of the substrate 210 on which the photovoltaic cell element 220 is formed.

The creepage distance is the distance from a portion that can be touched by a user (or the outer peripheral frame) to the photovoltaic cell element 220 (conductive part); the distance indicated by a dashed line L in FIG. 1 is the creepage distance. The creepage distance differs according to the requested specification; for example, the creepage distance is approximately several tens of mm.

Here, when the creepage distance is increased in order to increase the safety, the area of the photovoltaic cell element 220 with respect to the size of the photovoltaic cell panel 200 (power generation area) becomes small. As a result, the power generation efficiency per unit area decreases in the photovoltaic cell module (not illustrated) including the photovoltaic cell panel 200.

As a method of solving this problem, as illustrated in FIG. 2, the creepage distance can be secured by adhering an insulating material 600 (for example, an insulating tape, etc.) to the photovoltaic cell panel 200 so as to cover the light receiving surface, the end surface, and the back surface of the photovoltaic cell panel 200.

Specifically, referring to FIG. 2, by covering the end part of the photovoltaic cell panel 200 with the insulating material 600, on the light receiving surface side, the distance along which the insulating material 600 and the front surface protective layer 230 are adhering to each other is also considered to be the creepage distance (light receiving surface side), and on the back surface side, the distance along which the insulating material 600 and the substrate 210 are adhering to each other is also considered to be the creepage distance (back surface side).

As illustrated in FIG. 3, a frame 400 is attached to the photovoltaic cell panel 200 having the insulating material 600 adhered to the peripheral end part, to form the photovoltaic cell module. In the frame 400, a fitting groove 400x is formed by an upper flange 410, a back surface flange 420, and a side wall part 430. When attaching the photovoltaic cell panel 200 to the fitting groove 400x of the frame 400, in order to prevent the photovoltaic cell panel 200 from coming off the frame 400, there is a need to fill the fitting groove 400x with an adhesive material 700 such as a silicone resin and butyl rubber, etc., such that the frame 400 and the photovoltaic cell panel 200 are adhered to each other when attaching the photovoltaic cell panel 200 (see, for example, Patent Literature 1).

Alternatively, instead of filling the fitting groove 400x with the adhesive material 700 as illustrated in FIG. 3, an adhesive tape, etc., having an adhesive applied on both sides of the adhesive tape, may be used as the insulating material 600. In this case, the frame 400 and the photovoltaic cell panel 200 are adhered to each other via the insulating material 600 (see, for example, Patent Literature 2).

CITATION LIST

Patent Literature

[PTL 1]
Japanese Unexamined Patent Application Publication No. 2012-253063
[PTL 2]
Japanese Unexamined Patent Application Publication No. 2012-1707

SUMMARY OF INVENTION

Technical Problem

However, when the frame 400 is adhered and attached to the photovoltaic cell panel 200, which has the insulating material 600 adhered to the peripheral end part, a new problem arises.

When the creepage distance is secured by adhering the insulating material 600 to the peripheral end part of the photovoltaic cell panel 200, the insulating material 600 should not become detached from the photovoltaic cell panel 200. Here, when the adhesive material 700 is applied in the fitting groove 400x of the frame 400, and the photovoltaic cell panel 200 is adhered, the photovoltaic cell panel 200 is adhered to the frame 400 via the insulating material 600.

When a load is applied to the photovoltaic cell module due to snow coverage or wind pressure, etc., after installation, the photovoltaic cell panel 200 may bend and move in a direction of separating from the frame 400. Referring to FIG. 4, when the photovoltaic cell panel 200 bends due to a load F, the end part of the photovoltaic cell panel 200 becomes displaced in a direction of being spaced apart from the frame 400.

At this time, when the insulating material 600 is adhered to the frame 400, the insulating material 600 follows the frame 400 and the insulating material 600 becomes detached from the photovoltaic cell panel 200, and as a result, a problem arises in that the creepage distance cannot be sufficiently secured.

Particularly, when the photovoltaic cell panel 200 bends due to the load F, the photovoltaic cell panel 200 moves by using the back surface flange 420 of the frame 400 as the fulcrum. Accordingly, the positional displacement and the detachment increases between the light receiving surface and the side end surface of the photovoltaic cell panel 200, and the insulating material 600, and it becomes significantly difficult to secure the creepage distance at these portions.

The present invention has been made in view of the above points, and a problem to be solved is to provide a photovoltaic cell module in which the insulating material, which is for securing a creepage distance, is prevented from being detached from the photovoltaic cell panel.

Solution to Problem

Requirements of a photovoltaic cell module are to include a photovoltaic cell panel whose planar shape is a rectangular shape; an insulating material adhered to the photovoltaic cell panel, so as to cover the photovoltaic cell panel from an outer peripheral part on a light receiving surface side, via a side end surface, to an outer peripheral part on a back surface side; and a frame member configured to protect a periphery of the photovoltaic cell panel to which the insulating material is adhered, wherein among a first side and a second side of the photovoltaic cell panel facing each other, at least on the first side, the insulating material, which is adhered to the light receiving surface and the side end surface of the photovoltaic cell panel, and the frame member, can be spaced apart from each other.

Advantageous Effects of Invention

According to the disclosed technology, a photovoltaic cell module can be provided, in which in which the insulating material, which is for securing a creepage distance, is prevented from being detached from the photovoltaic cell panel.

DESCRIPTION OF EMBODIMENTS

Figure 1:
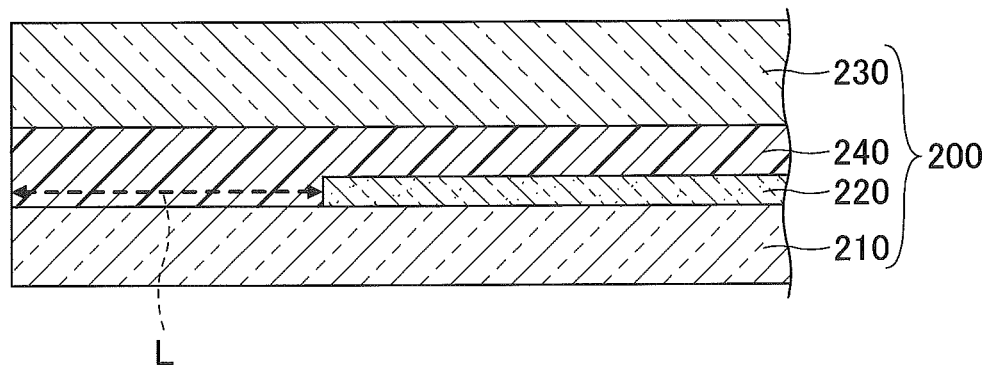
FIG. 1 is a cross-sectional view of an example of a conventional photovoltaic cell panel (part 1)
Figure 2:
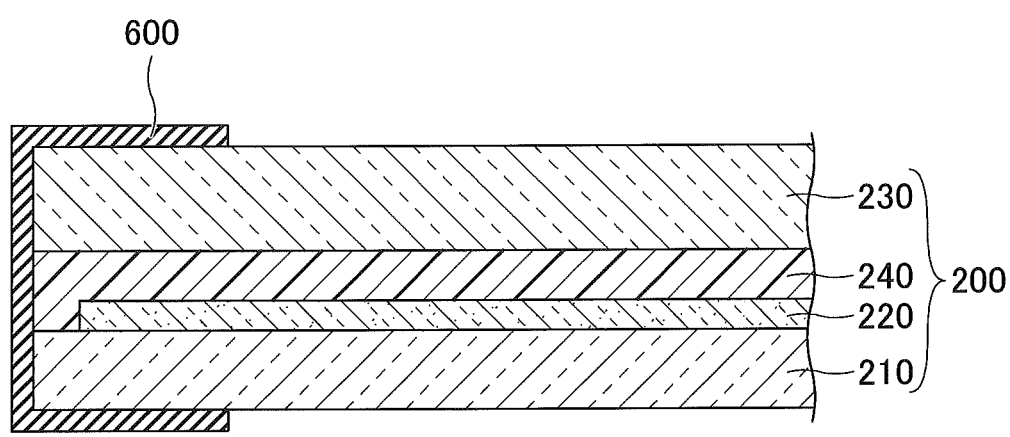
FIG. 2 is a cross-sectional view of an example of a conventional photovoltaic cell panel (part 2)
Figure 3:
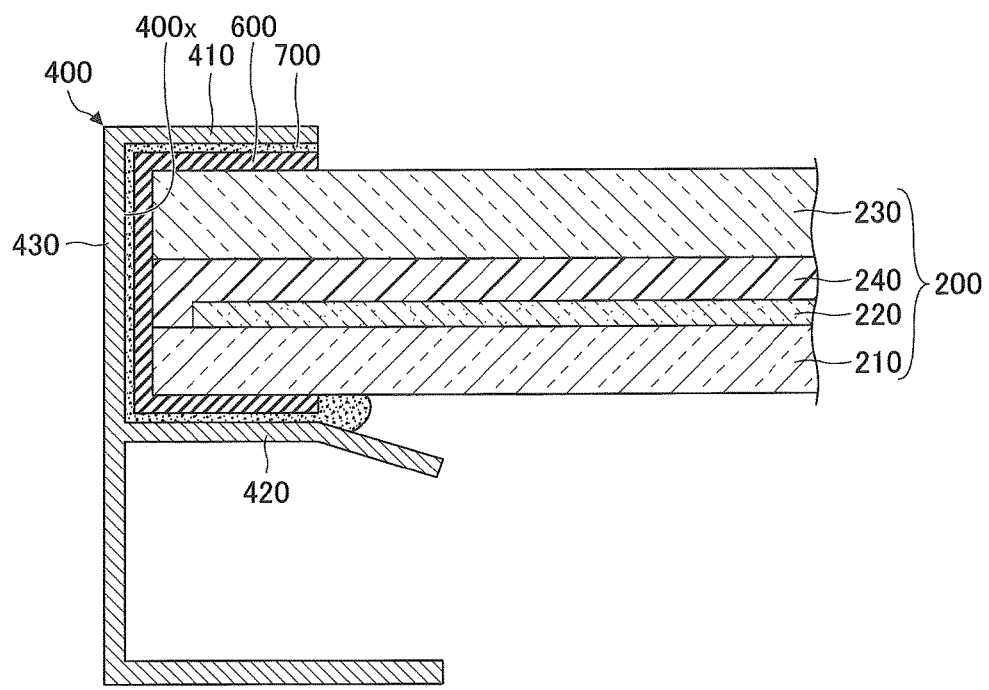
FIG. 3 is a cross-sectional view of an example of a conventional photovoltaic cell module.
Figure 4:
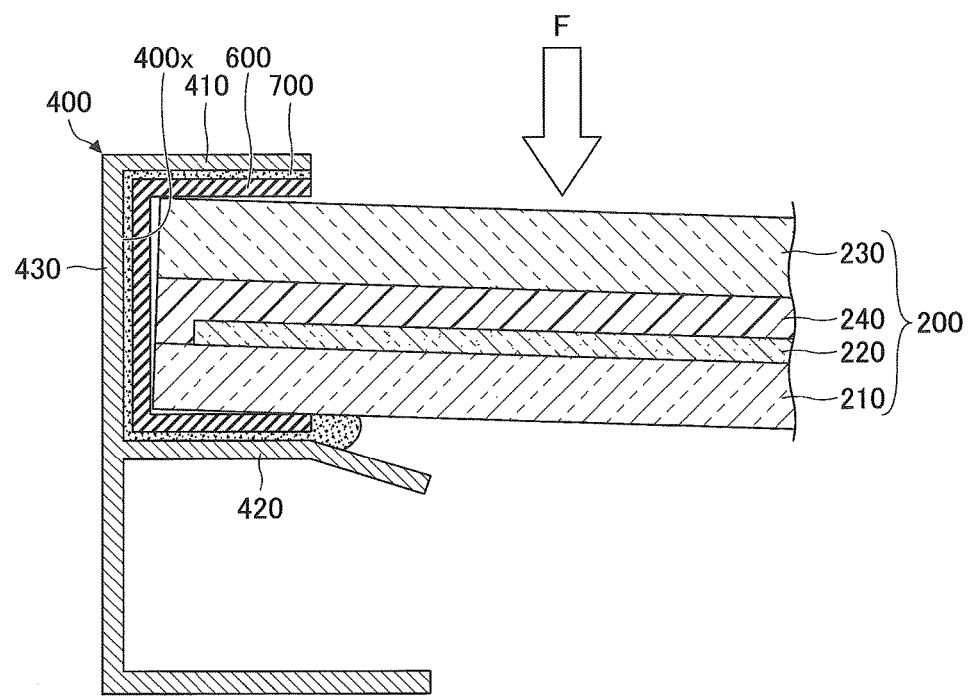
FIG. 4 is a cross-sectional view for describing a problem of a conventional photovoltaic cell module.

In the following, embodiments for carrying out the present invention will be explained with reference to drawings. Note that in the drawings, the same elements are denoted by the same reference numerals, and overlapping descriptions may be omitted.

First Embodiment

Figure 5:
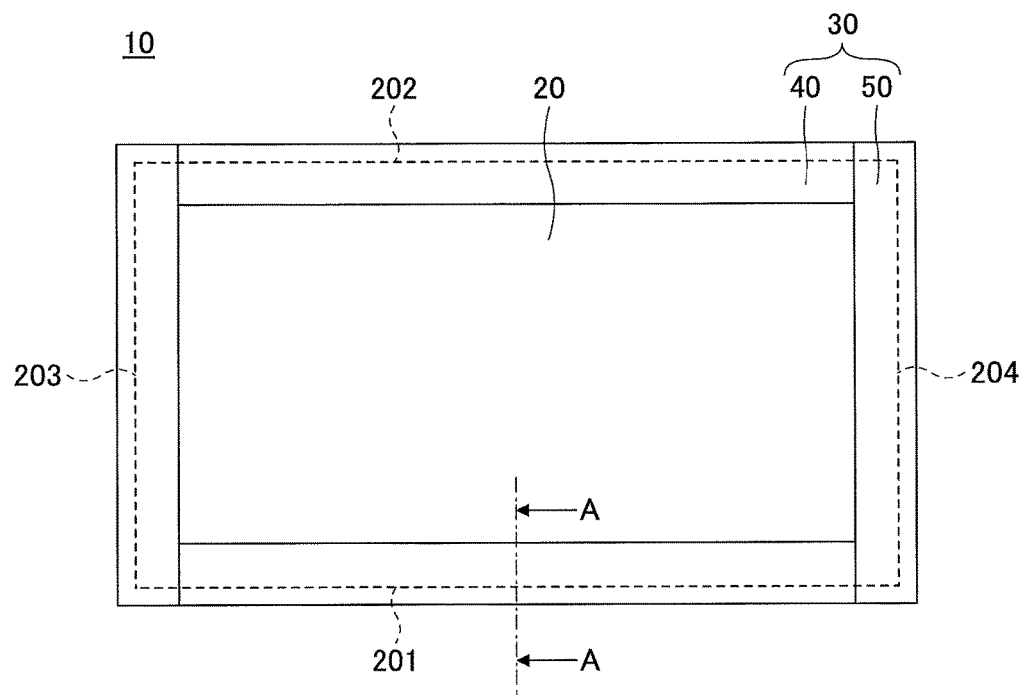
FIG. 5 is a plan view of an example of a photovoltaic cell module according to a first embodiment.
Figure 6:
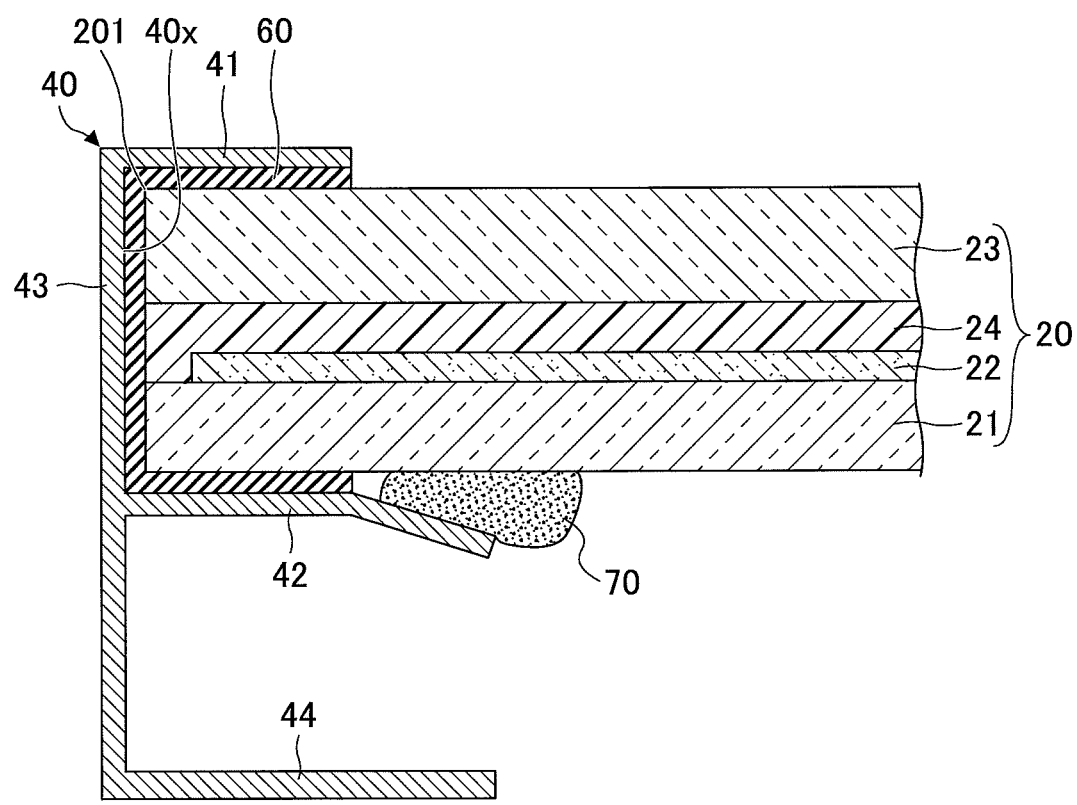
FIG. 6 is a partial enlarged cross-sectional view cut along line A-A in FIG. 5.

FIG. 5 is a plan view of an example of a photovoltaic cell module according to a first embodiment. FIG. 6 is a partial enlarged cross-sectional view cut along line A-A in FIG. 5.

Referring to FIGS. 5 and 6, a photovoltaic cell module 10 includes a photovoltaic cell panel 20 and a frame 30. The photovoltaic cell module 10 is a thin-film photovoltaic cell module having a substrate structure.

The photovoltaic cell panel 20 includes a substrate 21, a photovoltaic cell element 22, a front surface protective layer 23, and a sealing material 24. The planar shape of the photovoltaic cell panel 20 is, for example, a rectangular shape. The planar shape of the photovoltaic cell panel 20 is not limited to a rectangular shape; however, in the following, a description is given of an example of a case where the planar shape of the photovoltaic cell panel 20 is a rectangular shape. Note that the planar shape is the shape of viewing the target from the normal line direction of the light receiving surface of the photovoltaic cell panel 20.

In the photovoltaic cell panel 20, the substrate 21 is, for example, a glass substrate, a metal substrate, or a resin substrate, etc., having a thickness of approximately 1.0 mm through 3.0 mm, and the photovoltaic cell element 22 is formed on the substrate 21. In the photovoltaic cell element 22, for example, a plurality of layers of thin-films such as electrode layers and power generation layers, etc., are deposited.

On the surface of the substrate 21 on which the photovoltaic cell element 22 is formed, the front surface protective layer 23, which protects the light receiving surface side of the photovoltaic cell element 22, is adhered by the sealing material 24. As the front surface protective layer 23, for example, a white reinforced glass plate and a transparent resin plate, etc., having a thickness of approximately 0.5 mm through 4.0 mm, may be used. As the material of the sealing material 24, for example, EVA (Ethylene-vinyl acetate) and PVB (Polyvinyl butyral), etc., may be used. The thickness of the sealing material 24 is, for example, approximately 0.2 mm through 1.0 mm. Note that in the photovoltaic cell panel 20, the substrate 21 also functions as a back surface protective layer for protecting the back surface side of the photovoltaic cell element 22.

The frame 30 is a frame member that is attached so as to surround the peripheral end part of the photovoltaic cell panel 20. The frame 30 enhances the intensity of the photovoltaic cell panel 20, and covers the light receiving surface, the side end surface, and the back surface at the end part of the photovoltaic cell panel 20, to protect the periphery of the photovoltaic cell panel 20.

The frame 30 includes two long side frames 40 that are arranged facing each other, and two short side frames 50 that are arranged facing each other, surrounding the photovoltaic cell panel 20. The long side frames 40 and the short side frames 50 are connected so as to be adjacent to each other, to form the frame 30. The long side frames 40 protect a pair of sides facing each other (a first side 201 and a second side 202 on the long sides) of the photovoltaic cell panel 20 whose planar shape is a rectangular shape, and the short side frames 50 protect another pair of sides facing each other (a first side 203 and a second side 204 on the short sides). In this case, the long side frames 40 and the short side frames 50 are connected to each other in at right angles.

The long side frames 40 are long members that are formed by extrusion, etc., to have cross-sectional surfaces that are substantially the same shape, and are formed of, for example, aluminum steel and resin. The long side frame 40 includes an upper flange 41 for supporting the light receiving surface of the photovoltaic cell panel 20, a back surface flange 42 for supporting the back side of the photovoltaic cell panel 20, and a side wall part 43 for protecting the side end surface of the photovoltaic cell panel 20.

The upper flange 41 and the back surface flange 42 protrude from the side wall part 43 in the horizontal direction (toward the inside of the photovoltaic cell module 10), and the upper flange 41, the back surface flange 42, and the side wall part 43 form a fitting groove 40x into which the photovoltaic cell panel 20 is fit. Furthermore, a bottom side flange 44 protrudes from the bottom end of the side wall part 43, in the horizontal direction. Note that in the example of FIG. 6, the bottom side flange 44 extends in the horizontal direction toward the inside of the photovoltaic cell module 10; however, the bottom side flange 44 may extend in the horizontal direction toward the outside of the photovoltaic cell module 10.

At the end part of the photovoltaic cell panel 20, an insulating material 60 is adhered so as to form a U-shape in the cross-sectional view. Said differently, the insulating material 60 is adhered to the photovoltaic cell panel 20, so as to cover the outer peripheral part of the light receiving surface side of the photovoltaic cell panel 20 (the light receiving surface side of the front surface protective layer 23), via the side end surface of the photovoltaic cell panel 20, to the outer peripheral part of the back surface side of the photovoltaic cell panel 20 (the back surface side of the substrate 21). The end part of the photovoltaic cell panel 20 to which the insulating material 60 adheres, is fit in the fitting groove 40x of the long side frame 40. As the insulating material 60, for example, an insulating tape, etc., may be used.

The back surface flange 42 of the long side frame 40 protrudes up to a part where the substrate 21 is exposed (said differently, up to the area area where the substrate 21 is not covered by the insulating material 60), and the back surface flange 42 is adhered to the back side of the photovoltaic cell panel 20 by an adhesive material 70. Accordingly, the photovoltaic cell panel 20 is prevented from coming off the long side frames 40. As the adhesive material 70, for example, a butyl system adhesive material and a silicone system adhesive material may be used. Note that it is not essential to have the back surface flange 42 and the back surface of the photovoltaic cell panel 20 to be adhered to each other by the adhesive material 70; the back surface flange 42 and the back surface of the photovoltaic cell panel 20 may be adhered to each other according to need.

Here, the insulating material 60 and the long side frame 40 are non-adherent, and the insulating material 60 and the long side frames 40 may be spaced apart. By this structure, even when the photovoltaic cell panel 20 bends due to the load of snow coverage, and the photovoltaic cell panel 20 is shifted in a direction of being spaced apart from the long side frames 40, the long side frame 40 and the insulating material 60 can be spaced apart, and therefore the insulating material 60 follows the photovoltaic cell panel 20. Accordingly, the insulating material 60 does not peel off (does not become spaced apart) from the photovoltaic cell panel 20. As a result, even when a load is applied to the photovoltaic cell module 10, the creepage distance can be secured.

Note that with the structure illustrated in FIG. 6 in which the insulating material 60 and the long side frames 40 can be spaced apart, sufficient effects can be attained, even when this structure is only provided on one side among the first side 201 and the second side 202 facing each other in the photovoltaic cell panel 20.

The distance between the frames facing each other in the photovoltaic cell panel 20 does not change due to a load, and therefore the structure, in which the insulating material 60 and the frame 30 can be spaced apart from each other, only needs to be provided on one side among the first side 201 and the second side 202 facing each other in the photovoltaic cell panel 20. For example, when the insulating material 60 and the frame 30 can be spaced apart from each other on the first side 201, the insulating material 60 and the frame 30 may be adhered to each on the second side 202 that faces the first side 201. The reason is described below.

Even when the insulating material 60 and the frame 30 are adhered to each on the second side 202, the displacement of the photovoltaic cell panel 20, which is caused as the photovoltaic cell panel 20 separates from the frame 30 due to the bending of the first side 201, mainly occurs on the first side 201 where the insulating material 60 and the frame 30 can be spaced apart from each other.

As a result, on the second side 202 where the insulating material 60 and the frame 30 are adhered to each other, the displacement of the photovoltaic cell panel 20 is small and the insulating material 60 does not become detached from the photovoltaic cell panel 20. Furthermore, on the first side 201 where the insulating material 60 and the frame 30 can be spaced apart from each other, even when the photovoltaic cell panel 20 becomes displaced and separates from the frame 30, the insulating material 60 follows the photovoltaic cell panel 20 and does not become detached from the photovoltaic cell panel 20.

Furthermore, the first side 201 and the second side 202, facing each other in the photovoltaic cell panel 20, may both have the separation structure illustrated in FIG. 6. That is, in addition to the first side 201 where the insulating material 60 and the frame 30 can be spaced apart from each other, the second side 202 facing the first side 201 may also have the structure in which the insulating material 60 and the frame 30 can be spaced apart from each other. In this case also, as a matter of course, even when the photovoltaic cell panel 20 bends due to a load, etc., the insulating material 60 will not become detached from the photovoltaic cell panel 20, and the creepage distance can be secured.

Note that in FIG. 6, the cross-section of the long side frame 40 is illustrated, and a description is given with respect to the long side frame 40; however, this separation structure may be applied to the short side frame 50.

Furthermore, as illustrated in FIG. 6, it is preferable that a gap is formed between the adhesive material 70 and the insulating material 60, such that the adhesive material 70 and the insulating material 60 are not in contact. However, even if the insulating material 60 and the adhesive material 70 are in contact (even if the insulating material 60 adhered to the back surface of the photovoltaic cell panel 20 and the frame are adhered to each other via the adhesive material 70), the insulating material 60, which is adhered to the light receiving surface and the side end surface of the photovoltaic cell panel 20, and the frame can be spaced apart (non-adherent), and therefore an effect can be attained in that the insulating material 60 is prevented from being detached from the photovoltaic cell panel 20.

Furthermore, the adherence portions, where the back surface flange 42 and the back surface of the photovoltaic cell panel 20 are adhered to each other, may be intermittently arranged in the longitudinal direction of the frame, or may be arranged continuously along the entire longitudinal direction.

Furthermore, the photovoltaic cell module 10 illustrated in FIGS. 5 and 6 is described by taking as an example a substrate type thin-film photovoltaic cell in which the thin-film photovoltaic cell element 22 is formed on the substrate 21 (light receiving surface side); however, the photovoltaic cell module 10 is also applicable to a super straight type thin-film photovoltaic cell in which a thin-film photovoltaic cell element is formed on a cover glass (non-light receiving surface side). Furthermore, the photovoltaic cell module 10 is also applicable to a photovoltaic cell other than a thin-film photovoltaic cell.

Furthermore, as a specific example of the insulating material 60 covering the peripheral end part of the photovoltaic cell panel 20, the insulating material 60 preferably has a structure in which a material having insulation properties and flexibility is applied as a member on the front surface side (the side contacting the frame 30), a material having insulation properties and adhesion properties is applied as a member on the back surface side (the side adhering to the photovoltaic cell panel 20), and the member on the front surface side and the member of the back surface side are stacked.

More specifically, PET (polyethylene terephthalate), PVF (Polyvinyl fluoride), PP (polypropylene), polyimide resin, a fluorocarbon resin sheet, and elastomer, etc., are preferably used as the member on the front surface side, and an acrylic adhesive material and an adhesive system resin such as a thermoplastic resin (EVA and PVB), a thermosetting resin, a butyl system adhesive material, and a silicone system adhesive material, etc., are preferably used as the member on the back surface side.

However, the insulating material 60 is not limited to a flexible material; for example, a resin, which is formed to have a U-shape in advance such as gasket, may be applied as the insulating material 60, and the insulating material 60 may be adhered to the photovoltaic cell panel 20 by a member having an adhering function as described above.

As described above, in the photovoltaic cell module 10 according to the first embodiment, the insulating material 60, which is adhered to the light receiving surface and the side end surface of the photovoltaic cell panel 20, and the frame 30 can be spaced apart, on at least one side among the two sides of the first side 201 and the second side 202 facing each other in the photovoltaic cell panel 20 (however, in addition to the above, the insulating material 60, which is adhered to the back surface of the photovoltaic cell panel 20, and the frame 30 may be spaced apart, on one side where the insulating material 60 and the frame 30 can be spaced apart).

Accordingly, even when a load such as snow coverage is applied on the surface of the photovoltaic cell panel 20 and the photovoltaic cell panel 20 bends, the insulating material 60 does not follow frame 30, and therefore the insulating material 60 does not separate from the photovoltaic cell panel 20, and the creepage distance can be secured.

Furthermore, on one side where the insulating material 60 and the frame 30 can be spaced apart from each other, the back surface flange of the frame 30 and the back surface of the photovoltaic cell panel 20 are adhered to each other, and therefore the photovoltaic cell panel 20 is prevented from coming off the frame 30.

Modification Example of First Embodiment

A modification example of the first embodiment indicates an example of a photovoltaic cell module using a resin protecting sheet referred to as a back sheet, as a back surface protective layer. Note that in the modification example of the first embodiment, descriptions of the same elements as those of the embodiment already described may be omitted.

Figure 7:
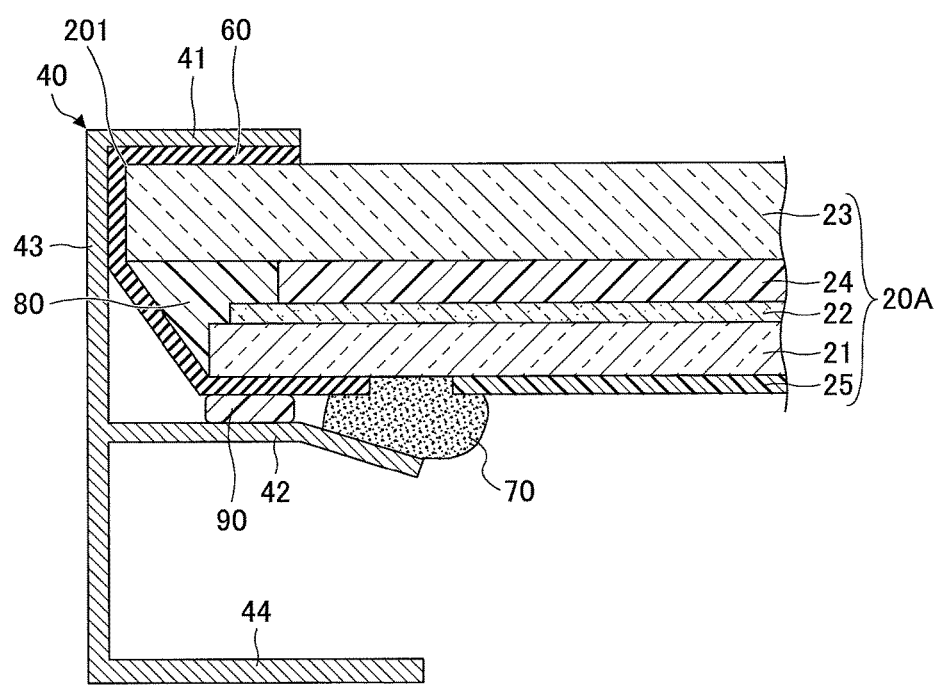
FIG. 7 is a partial enlarged cross-sectional view of an example of the photovoltaic cell module according to the modification example of the first embodiment.

FIG. 7 is a partial enlarged cross-sectional view of an example of the photovoltaic cell module according to the modification example of the first embodiment, and indicates a cross-sectional view corresponding to FIG. 6. Note that the plan view is the same as that of FIG. 5, and therefore a diagram of the plan view is omitted. Referring to FIG. 7, the difference from the photovoltaic cell module 10 (see FIGS. 5 and 6), is that the photovoltaic cell panel 20 is replaced with a photovoltaic cell panel 20A in the photovoltaic cell module according to the modification example of the first embodiment.

In the photovoltaic cell panel 20A, a back surface protective layer 25 is provided on the back surface of the substrate 21. The back surface protective layer 25 is a protecting sheet referred to as a back sheet, and has an effect of preventing the substrate 21 from cracking, and an effect of preventing moisture from entering from outside. As the material of the back surface protective layer 25, for example, a fluororesin, aluminum foil, and polyethylene terephthalate resin (PET resin), etc., and a layered material of these materials may be used.

In the photovoltaic cell panel 20A, the planar shape of the substrate 21 is smaller than the planar shape of the front surface protective layer 23, and the planar shape of the sealing material 24 is even smaller than the planar shape of the substrate 21, and these members are deposited such that the centers of the members substantially match each other. Therefore, there are steps at the side end part of the photovoltaic cell panel 20A, and a seal material 80 is provided so as to fill in the steps, and the side end surface of the seal material 80 is a tilted surface.

By the seal material 80, the substrate 21 on which the photovoltaic cell element 22 is formed on the side of the light receiving surface, the front surface protective layer 23, and the outer peripheral side of the sealing material 24 are adhered to each other. As the seal material 80, an adhesive system resin may be used; for example, butyl rubber and a silicone system resin, etc., may be used. An electrode ribbon (not illustrated), which is attached to the electrode of the photovoltaic cell element 22, for example, may be passed in the seal material 80.

A buffer material 90 (for example, foamed resin, etc.) may be inserted between the back surface flange 42 of the long side frames 40 and the insulating material 60. By inserting the buffer material 90, the photovoltaic cell panel 20A is pushed up toward the light receiving surface side, and there will be no gap between the insulating material 60 and the upper flange 41 on the light receiving surface side, and an effect of preventing moisture from entering from between the insulating material 60 and the upper flange 41 can be achieved.

Furthermore, as illustrated in FIG. 7, when the back surface protective layer 25 is attached to the back surface side of the substrate 21, it is preferable to cover the end part of the back surface protective layer 25 with the adhesive material 70. Furthermore, the adhesive material 70 preferably also acts as the adhesive material for adhering the back surface flange 42 and the back surface of the photovoltaic cell panel 20A to each other.

As described above, by covering the end part of the back surface protective layer 25 with the adhesive material 70, it is possible to prevent the detachment of the back surface protective layer 25. Furthermore, by making the adhesive material 70 also act as the adhesive material for adhering the back surface flange 42 and the back surface of the photovoltaic cell panel 20A to each other, it is possible to reduce the usage amount of the adhesive material, and simplify the manufacturing procedures. Other effects are the same as those of the first embodiment.

Preferred embodiments of are described in detail above; however, the present invention is not limited to the embodiments described in above, and various modifications and replacements may be added to the above embodiments without departing from the scope of the claims.

The present international application claims priority to Japanese Patent Application No. 2014-191158, filed on Sep. 19, 2014, the contents of which are incorporated herein by reference in their entirety.

REFERENCE SIGNS LIST 10 photovoltaic cell module
20, 20A photovoltaic cell panel
21 substrate
22 photovoltaic cell element
23 front surface protective layer
24 sealing material
25 back surface protective layer
30 frame
40 long side frame
40x fitting groove
41 upper flange
42 back surface flange
43 side wall part
44 bottom side flange
50 short side frame
60 insulating material
70 adhesive material
80 seal material
90 buffer material
201, 203 first side
202, 204 second side

The invention claimed is:

1. A photovoltaic cell module comprising:
a photovoltaic cell panel whose planar shape is a rectangular shape;
an insulating material adhered to the photovoltaic cell panel, so as to cover the photovoltaic cell panel from an outer peripheral part on a light receiving surface side, via a side end surface, to an outer peripheral part on a back surface side;
a frame member configured to protect a periphery of the photovoltaic cell panel by a structure where the periphery of the photovoltaic cell panel is adhered to the insulating material and inserted into the frame member,
wherein among a first side and a second side of the photovoltaic cell panel facing each other, at least on the first side, the insulating material, which is adhered to the light receiving surface and the side end surface of the photovoltaic cell panel, is not adhered to the frame member so that the insulating material and the frame member can be spaced apart from each other,
the frame member includes a back surface flange configured to support the back surface side of the photovoltaic cell panel, and
on the first side where the insulating material and the frame member can be spaced apart from each other, the back surface flange and the back surface of the photovoltaic cell panel are directly adhered to each other by an adhesive material.

2. The photovoltaic cell module according to claim 1, wherein
the photovoltaic cell panel includes a photovoltaic cell element, a front surface protective layer configured to protect the light receiving surface side of the photovoltaic cell element, and a back surface protective layer configured to protect the back surface side of the photovoltaic cell element,
the insulating material is adhered to the photovoltaic cell panel, so as to cover the photovoltaic cell panel from an outer peripheral part on a light receiving surface side of the front surface protective layer to an outer peripheral part on a back surface side of the back surface protective layer, and
the back surface protective layer is a glass substrate.

3. The photovoltaic cell module according to claim 2, wherein a protecting sheet made of a polyethylene terephthalate resin is provided on the back surface of the back surface protective layer.

4. The photovoltaic cell module according claim 1, wherein on the second side, which faces the first side where the insulating material and the frame member can be spaced apart from each other, the insulating material and the frame member are adhered to each other.

5. The photovoltaic cell module according claim 1, wherein the insulating material includes an insulating tape.

6. The photovoltaic cell module according claim 1, wherein the insulating material and the frame member are partially spaced apart from each other when the photovoltaic cell panel is bent.

* * * * *